(12) United States Patent
Ting

(10) Patent No.: US 9,666,534 B2
(45) Date of Patent: May 30, 2017

(54) SEMICONDUCTOR INTERCONNECT STRUCTURE AND MANUFACTURING METHOD THEREOF

(71) Applicant: TAIWAN SEMICONDUCTOR MANUFACTURING COMPANY LTD., Hsinchu (TW)

(72) Inventor: Chih-Yuan Ting, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 340 days.

(21) Appl. No.: 14/276,398

(22) Filed: May 13, 2014

(65) Prior Publication Data

US 2015/0332999 A1    Nov. 19, 2015

(51) Int. Cl.
| | |
|---|---|
| H01L 21/4763 | (2006.01) |
| H01L 23/532 | (2006.01) |
| H01L 23/528 | (2006.01) |
| H01L 21/768 | (2006.01) |
| H01L 23/522 | (2006.01) |

(52) U.S. Cl.
CPC .... *H01L 23/53295* (2013.01); *H01L 21/7682* (2013.01); *H01L 21/76802* (2013.01); *H01L 21/76816* (2013.01); *H01L 21/76826* (2013.01); *H01L 21/76832* (2013.01); *H01L 21/76834* (2013.01); *H01L 23/528* (2013.01); *H01L 23/5222* (2013.01); *H01L 23/5329* (2013.01); *H01L 21/76852* (2013.01); *H01L 2924/0002* (2013.01)

(58) Field of Classification Search
CPC ............ H01L 21/76802; H01L 21/768; H01L 21/76816; H01L 21/7682; H01L 21/76826
See application file for complete search history.

(56) References Cited

U.S. PATENT DOCUMENTS

| | | | |
|---|---|---|---|
| 9,123,727 B2 * | 9/2015 | Fischer | ............... H01L 21/7685 |
| 2007/0257368 A1 * | 11/2007 | Hussein | .............. H01L 21/7682 257/758 |
| 2011/0021036 A1 * | 1/2011 | Braecklmann | ...... H01L 21/7682 438/763 |

* cited by examiner

*Primary Examiner* — Bradley K Smith
(74) *Attorney, Agent, or Firm* — Chun-Ming Shih

(57) ABSTRACT

The present disclosure provides an interconnect structure, including a low k dielectric layer with an air gap region and a non-air gap region. A first conductive line is positioned in the air gap region, and a second conductive line is positioned in the non-air gap region of the low k dielectric layer. A height of the first conductive line is different from a height of the second conductive line. The present disclosure also provides a method for manufacturing a semiconductor interconnect structure, including forming a photoresist layer over a hard mask layer with openings exposing a low k dielectric layer; treating the low k dielectric layer to be more hydrophilic through the openings of the hard mask layer; and removing the treated low k dielectric region to form an air gap in the air gap region.

20 Claims, 20 Drawing Sheets

SEMICONDUCTOR INTERCONNECT STRUCTURE AND MANUFACTURING METHOD THEREOF

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A, 6B, 6C, 8, 10A, 10B, 11B, 12B are cross sectional views of operations for manufacturing an interconnect structure with localized air gap, in accordance with some embodiments of the present disclosure.

DETAILED DESCRIPTION

Figure 1:
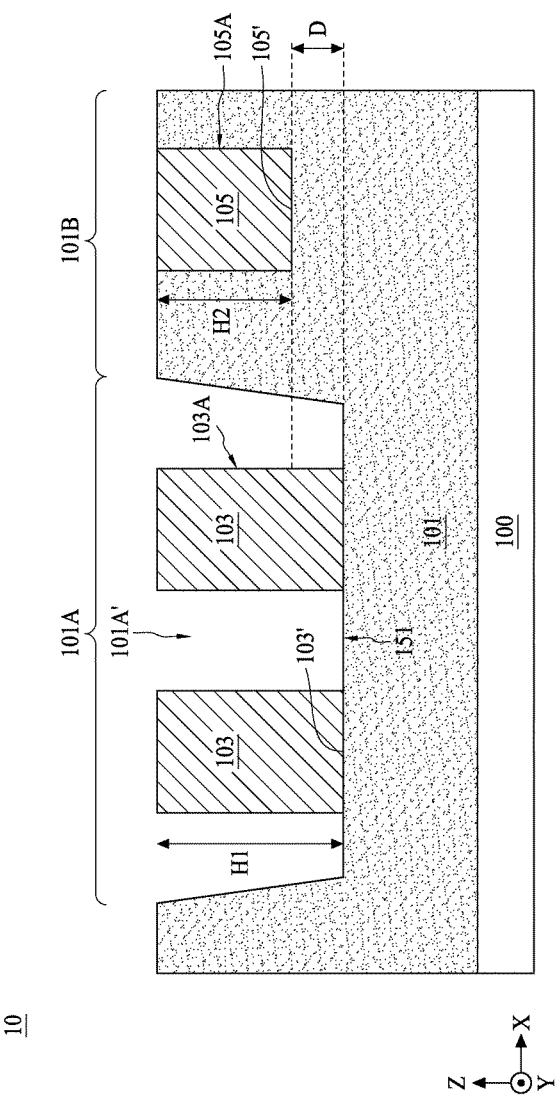
FIG. 1 is a cross sectional view of an interconnect structure with localized air gap, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In semiconductor manufacturing, a low K dielectric is a material with a small dielectric constant relative to silicon dioxide. Low K dielectric material implementation is one of several strategies used to allow continued scaling of microelectronic devices. In integrated circuits, insulating dielectrics separate the conducting parts (i.e., wire interconnects) from one another. As components have scaled and transistors have been fabricated closer together, the insulating dielectrics have thinned to the point where charges build up and crosstalk may, in some instance, adversely affect the performance of the device. Replacing the traditional silicon dioxide dielectric layers with a low K dielectric of the same thickness reduces parasitic capacitance, thus enabling faster switching speeds and lower heat dissipation.

Traditional dielectric layers such as silicon dioxide have a relatively high dielectric constant of about 3.9, while some other materials such as fluorine silicon oxide have a dielectric constant of about 3.7. A class of materials typically referred to as low K dielectric materials have a dielectric constant of about 3.0 or lower, while a dielectric constant of 2.0 or less is deemed to an ultra low K dielectric material. Air, on the other hand, has a dielectric constant of 1.0. Strategies to use various low K dielectric materials suffer from poor mechanical properties, poor adhesion, difficult integration, and poor defect control. A universal air gap maximizes the volume of low K dielectric materials but generates serious via landing problem. Conductive vias positioned on a layer higher than the universal air gap suffer poor mechanical support. In addition, tolerance to the misalignment of the upper layer conductive vias is small in the universal air gap low k dielectric structure.

Localized air gap somehow provides a larger landing area for the upper layer conductive vias. An additional lithography operation is conducted to remove the low k dielectric layer in a predetermined and localized region. However, the extra plasma dry etch operation imposed to remove the low k dielectric layer inevitably damages the metal lines positioned in the air gap region. Subsequent operations can further damage the metal lines and thus extra operations shall be conducted to restore the mechanical and electrical properties of the metal lines, in order to pass the interconnect reliability test.

The present disclosure provides an interconnect structure with localized air gap but the integrity of the metal line positioned in the air gap region is not deteriorated during the manufacturing operations. In some embodiments, the metal lines in the air gap region and in the non-air gap region can have different heights. Since the air gap region is localized, the via landing overlay problems can be solved.

The present disclosure provides a manufacturing method for preparing an interconnect structure with localized air gap. The method provided herein does not include further lithography operations for the formation of the localized air gap after the metal line is deposited. Consequently, no further damages to the metal lines during subsequent lithography operations. Hence, the integrity of the metal lines can be protected in a better condition compared to those metal lines prepared by conventional operations, where a dry etch operation is imposed through a patterned photoresist layer to remove the low k dielectric materials surrounding the metal lines and form the air gap. Furthermore, the exposed metal lines are subjected to chemical damages for photoresist stripping.

Referring to FIG. 1, a cross sectional view of an interconnect structure 10 with an air gap 101A' is shown. Air gap 101A' is a localized air gap accommodating first conductive lines 103. In some embodiments, the first conductive lines 103 and the air gap 101A's are collectively referred to an air gap region 101A of a dielectric layer 101. The dielectric layer 101 is positioned over a substrate 100. In some embodiments, the interconnect structure 10 may not include a substrate 100. Adjacent to the air gap region 101A is a non-air gap region 101B including a second conductive line 105 surrounded by the dielectric layer 101. In some embodiments, the first conductive line 103 illustrated in the interconnect structure 10 extends along the Y direction such that a bottom 103' of the first conductive line 103 is in contact with the dielectric layer 101. Similarly, the second conductive line 105 also extends along the Y direction. However, in other embodiments, the first conductive line 103 and/or the second conductive line 105 can be interconnect vias which electrically connect a conductive region at the bottom (103' or 105') to another conductive line or external circuits at the other end of the vias (not shown in FIG. 1).

In some embodiments, the substrate 100 can be an elementary semiconductor including silicon or germanium in crystal, polycrystalline, or an amorphous structure; a compound semiconductor including silicon carbide, gallium arsenic, gallium phosphide, indium phosphide, indium arsenide, and indium antimonide; an alloy semiconductor including SiGe, GaAsP, AlInAs, AlGaAs, GaInAs, GaInP, and GaInAsP; any other suitable material; or combinations thereof. In one embodiment, the alloy semiconductor substrate may have a gradient SiGe feature in which the Si and Ge composition change from one ratio at one location to another ratio at another location of the gradient SiGe feature. In another embodiment, the gradient SiGe feature is formed over a silicon substrate. In yet another embodiment, the gradient SiGe feature is strained. Furthermore, the semiconductor substrate may be a semiconductor on insulator, such as a silicon on insulator (SOI), or a thin film transistor (TFT). In some examples, the semiconductor substrate may include a doped epitaxial layer or a buried layer. In some other examples, the compound semiconductor substrate may have a multilayer structure, or the substrate may include a multilayer compound semiconductor structure.

In some embodiments, the dielectric layer 101 may include at least one of the following materials, such as carbon-containing silicon oxide, carbon-containing silicon nitride, carbon-containing silicon oxynitride, carbon-containing low-k dielectric material, ultra low-k dielectric material, or any combinations thereof. In some embodiments, the dielectric layer 101 can be made of a low-k dielectric material having a dielectric constant k less than or equal to 3, such as Black Diamond® available from Applied Materials, Incorporated®. In some other embodiments, the dielectric layer 101 may be made of, without limitation, fluorinated silicate glass (FSG) or undoped silicate glass (USG). In still other embodiments, the materials selected for dielectric layer 101 are susceptible to carbon reduction by anisotropic dry gas plasma chemistries.

In some embodiments, the first conductive line 103 and the second conductive line 105 include at least one material such as copper (Cu), tungsten (W), aluminum (Al), Al/Cu, graphene, carbon nanotubes (CNT), carbon nanocapsules, other conbon-based or metallic-based conductive materials, or any combinations thereof. As shown in FIG. 1, a major direction for the first conductive line 103 and the second conductive line 105 are defined as the direction perpendicular to a surface of the substrate 100, that is, along the Z direction. A height H1 along the major direction of the first conductive line 103 is greater than a height H2 along the major direction of the second conductive line 105 by a difference D. In other words, the bottom 103' of first conductive line 103 and the bottom 105' of second conductive line 105 demonstrate a measurable shift equivalent to a difference D, regardless of whether the bottom 103' of the first conductive line 103 is over or under a bottom surface of the air gap 101A'. In some embodiments, the difference D can be in a range of from about 10% to about 50% of the height H1.

The first conductive line 103 and the second conductive line 105 can be distinguished by the region they respectively reside in. For example, the first conductive line 103 is positioned in the air gap region 101A, whereas the second conductive line 105 is positioned in the non-air gap region 101B. In addition, a sidewall 103A the first conductive line 103 is surrounded by air gap 101A', while a sidewall 105A of the second conductive line 105 is surrounded by the dielectric layer 101. In some embodiments, a liner material (not shown) can be formed along the sidewall 105A and the bottom 105' of the second conductive line 105. The liner material can include, not in a limited way, silicon nitride, silicon oxynitride (SiON), silicon oxycarbide (SiOC), silicon carbon nitride (SiCN), silicon carbon oxynitride (SiCON), silicon carbide (SiC), other liner materials, or any combinations thereof. Furthermore, the bottom 103' of the first conductive line 103 can be disposed on a bottom surface 151 of the air gap 101A' as shown in FIG. 1, or be buried under the bottom surface 151 of the air gap 101A' (not shown). In other words, the first conductive line 103 can be partially buried in the dielectric layer 101, whereas the second conductive line 105 is completely buried in the dielectric layer 101.

Figure 2:
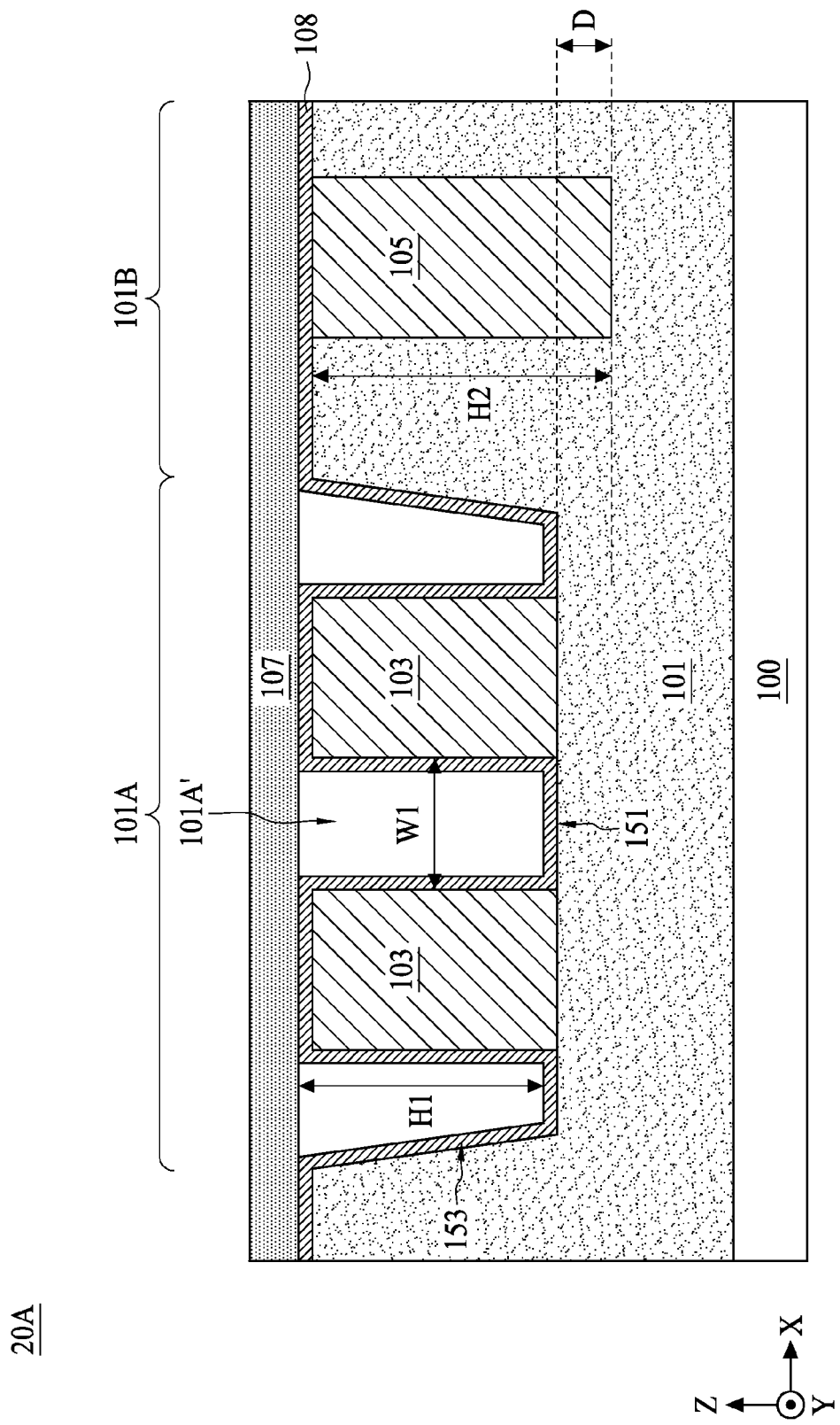
FIG. 2 is a cross sectional view of an interconnect structure with localized air gap, in accordance with some embodiments of the present disclosure.

Referring to FIG. 2, a cross sectional view of an interconnect structure 20A with an air gap 101A' is shown. Repeated numeral labels shown in FIG. 2 are referred to the same elements or their equivalents in FIG. 1, and are not repeated here for simplicity. In FIG. 2, the second conductive line 105 of the interconnect structure 20A possesses a height H2 greater than the height H1 of the first conductive line 103 by a difference D. In some embodiments, the height H2 can be greater than the height H1. In other embodiments, the height H2 is less than the height H1. In some embodiments, a ratio of the height H1 and the height H2 is in a range of from about 0.8 (for embodiments with H2>H1) to about 1.5 (for embodiments with H1>H2).

Referring again to FIG. 2, a cap layer 107 is positioned over the air gap region 101A and the non-air gap region 101B of the dielectric layer 101. In some embodiments, the cap layer 107 includes ceramics, metal oxynitrides $M_xO_yN_z$, dielectric films, organic polymer films, or the combinations thereof. The M in $M_xO_yN_x$ refers to metal, for example, Al, Mn, Co, Ti, Ta, W, Ni, Sn, or Mg. The O refers to oxygen and N refers to nitrogen. In some embodiments, the stoichiometry x, y, z for $M_xO_yN_z$ can have x in a range of from about 20 to about 70 atomic percent, y in a range below 80 atomic percent, and z in a range below 80 atomic percent. In some embodiments, the oxygen and nitrogen content is greater than the metal content in $M_xO_yN_z$, that is, y and z are greater than x. The dielectric films for the cap layer 107 can include SiCN, SiN, $SiO_2$, SiON, SiOC, or SiOF. In some embodiments, the cap layer 107 possesses a thickness of from about 5 Å to about 50 Å. The air gap 101A' shown in FIG. 2 is a closed space and the cap layer 107 is allowed to support more conductive lines to be stacked over the interconnect structure 20A.

Referring again to FIG. 2, a conformal barrier layer 108 is deposited over the dielectric layer 101 and the first conductive lines 103. A conformal deposition allows the barrier layer 108 to conform with the surface morphology of the air gap 101A; and the first conductive lines 103. In some embodiments, the conformal barrier layer 108 includes ceramics, metal oxynitrides $M_xO_yN_z$, dielectric films, or the combinations thereof. The M in $M_xO_yN_z$ refers to metal, for example, Al, Mn, Co, Ti, Ta, W, Ni, Sn, or Mg. The O refers to oxygen and N refers to nitrogen. In some embodiments, the stoichiometry x, y, z for $M_xO_yN_z$ can have x in a range of from about 20 to about 70 atomic percent, y in a range below 80 atomic percent, and z in a range below 80 atomic percent. In some embodiments, the oxygen and nitrogen content is greater than the metal content in $M_xO_yN_z$, that is, y and z are greater than x. The dielectric films for the conformal barrier layer 108 can include SiCN, SiN, $SiO_2$, SiON, SiOC, or SiOF. In some embodiments, the conformal barrier layer 108 possesses a thickness of from about 5 Å to about 50 Å.

Still referring to FIG. 2, a separation W1 between two adjacent first conductive lines 103 cannot be too wide otherwise the cap layer 107 may lack of mechanical support and falls into the air gap 101A'. In some embodiments, the separation W1 between two adjacent first conductive lines 103 is lower than about 50 nm. The separation W1 refers to a distance between the sidewalls of two adjacent first conductive lines 103 or a distance between the conformal barrier layer 108 formed on the sidewalls of two adjacent first conductive lines 103. In some embodiments, a shortest separation between the first conductive line 103 and a sidewall 153 of the air gap 101A' is lower than about 50 nm.

Figure 3:
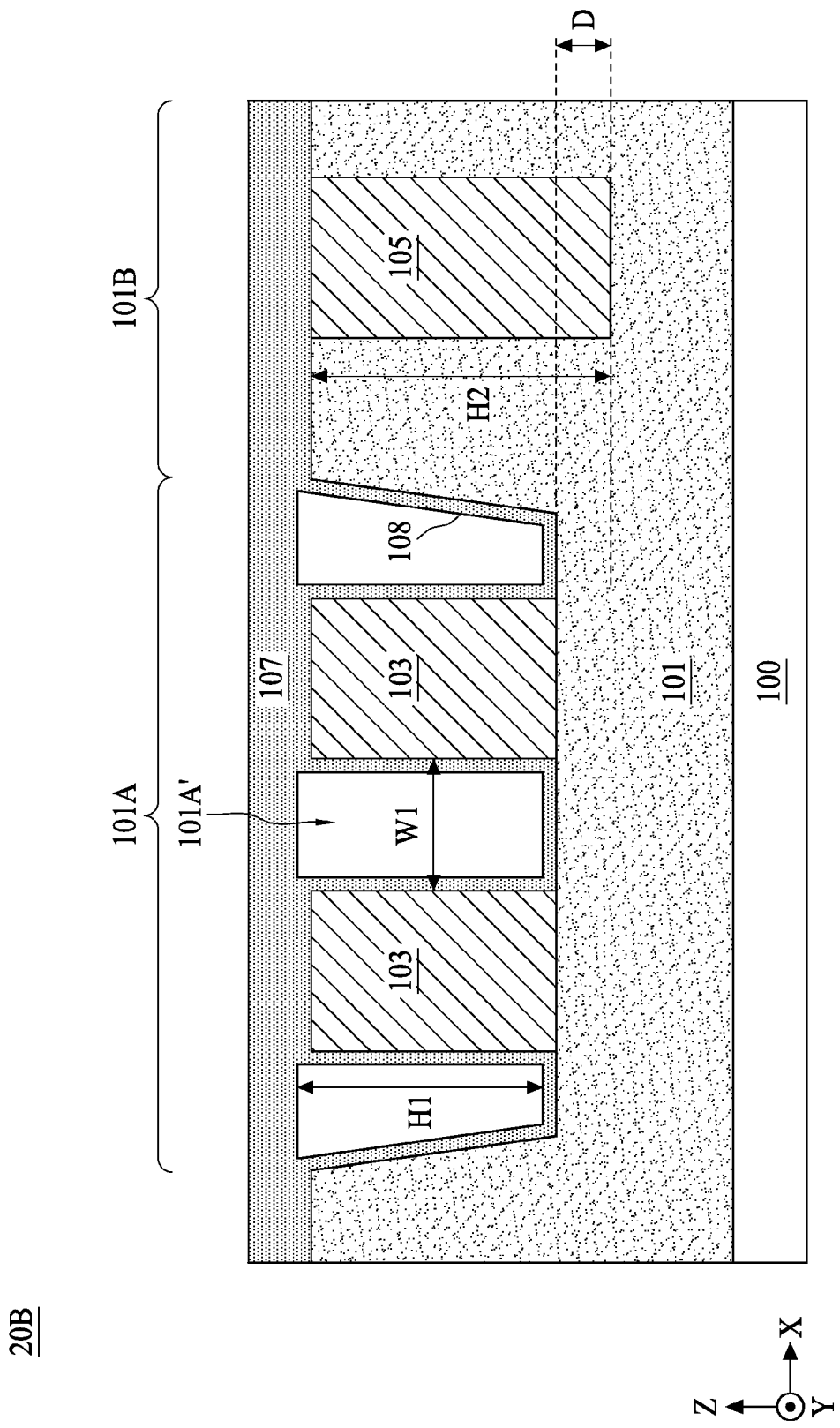
FIG. 3 is a cross sectional view of an interconnect structure with localized air gap, in accordance with some embodiments of the present disclosure.

Referring to FIG. 3, a cross sectional view of an interconnect structure 20B with an air gap 101A' is shown. Repeated numeral labels shown in FIG. 3 are referred to the same elements or their equivalents in FIG. 1 and FIG. 2, and are not repeated here for simplicity. A difference between the interconnect structure 20A and 20B is in that the conformal barrier layer 108 in the interconnect structure 20B can be composed of substantially identical materials of the cap layer 107. In some embodiments, the formation of the conformal barrier layer 108 of structure 20A is an independent operation conducted prior to the formation of the cap layer 107. However, the formation of the conformal barrier layer 108 of structure 20b is the same operation to the formation of the cap layer 107.

Figure 4:
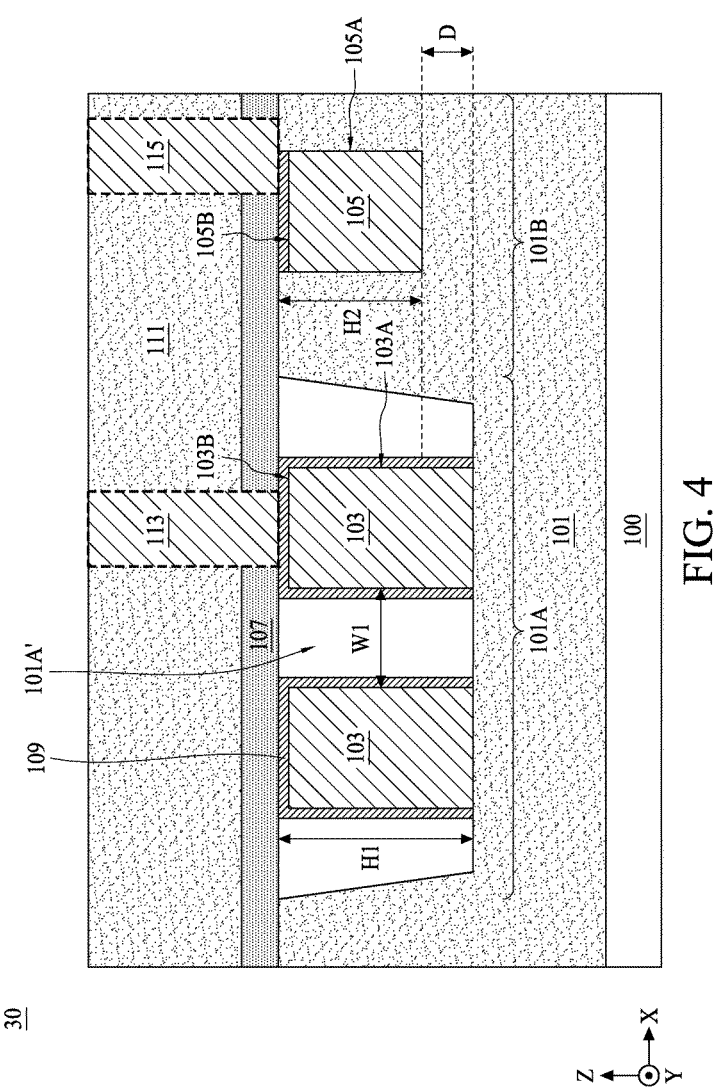
FIG. 4 is a cross sectional view of an interconnect structure with localized air gap, in accordance with some embodiments of the present disclosure.

Referring to FIG. 4, a cross sectional view of an interconnect structure 30 with an air gap 101A' is shown. Repeated numeral labels shown in FIG. 4 are referred to the same elements or their equivalents in FIG. 1 to FIG. 3, and are not repeated here for simplicity. In FIG. 4, a conformal metal layer 109 is formed only on a top surface 103B and a sidewall 103A of the first conductive line 103, and a top surface 105B of the second conductive line 105. In some embodiments, the conformal metal layer 109 includes cobalt (Co) and any other suitable metallic materials for selective deposition. Conductive lines 113 and 115 in the upper stack of the dielectric layer 111 are illustrated in dotted lines. For example, the conductive line 113 over the air gap region 101A possesses a width less than that of the first conductive line 103. The conductive line 115 over the non-air gap region may have a width more or less than that of the second conductive line 105. Moreover, conductive line 115 may partially overlay on the second conductive line 105.

Figure 5:
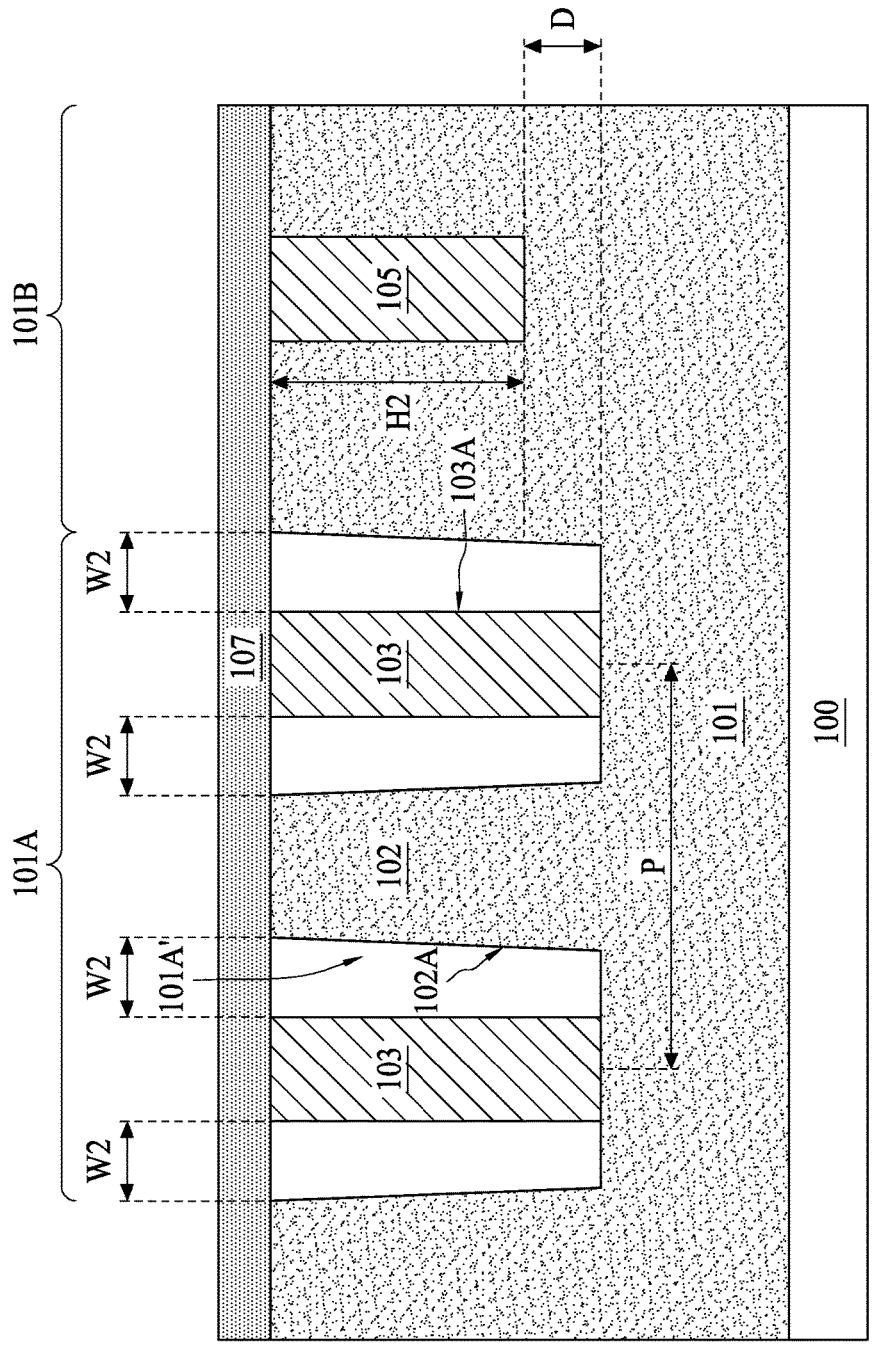
FIG. 5 is a cross sectional view of an interconnect structure with localized air gap, in accordance with some embodiments of the present disclosure.

Referring to FIG. 5, a cross sectional view of an interconnect structure 40 with an air gap 101A' is shown. Repeated numeral labels shown in FIG. 5 are referred to the same elements or their equivalents in FIG. 1 to FIG. 4, and are not repeated here for simplicity. The air gap region 101A in FIG. 5 includes not only the air gap 101A', the first conductive lines 103, as well as an internal dielectric layer 102. In some embodiments, the internal dielectric layer 102 is positioned between two adjacent first conductive lines 103, and is not in contact with the two first conductive lines 103. That is, the first conductive lines 103 in the air gap region 101A are surrounded by air gap 101A' despite the existence of the internal dielectric layer 102.

Still referring to FIG. 5, a separation W2 between a sidewall 103A of the first conductive line 103 and a sidewall 102A of the internal dielectric layer 102 cannot be too wide otherwise the cap layer 107 may lack of mechanical support and falls into the air gap 101A'. In some embodiments, the largest separation W2 is lower than about 50 nm. In some embodiments, the internal dielectric layer 102 is in tapered shape with a shorter end in contact with the cap layer 107, and hence, the largest separation between the sidewall 103A of the first conductive line 103 and the sidewall 102A of the internal dielectric layer 102 is the distance at the top surface of the internal dielectric layer 102. In some embodiments, when a pitch P between two adjacent first conductive lines 103 is greater than 50 nm, an internal dielectric layer 102 is positioned between in between.

Figure 6A:
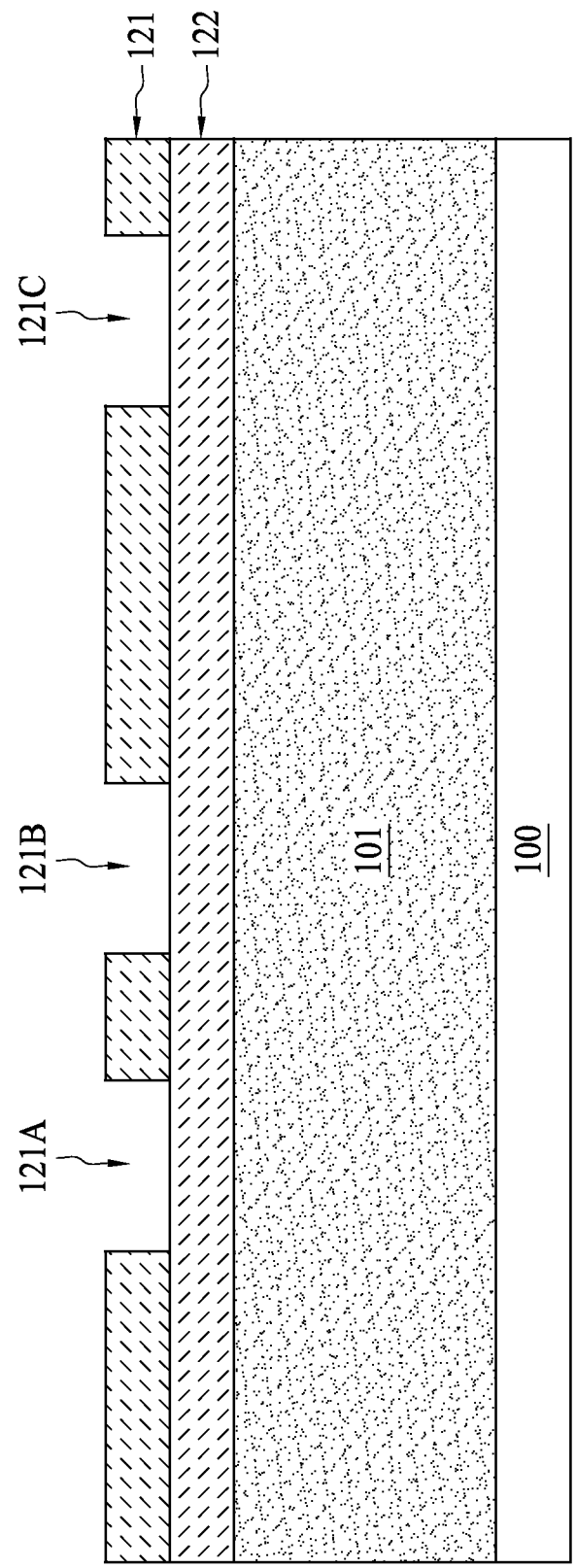
FIGS. 6A, 6B, 6C, 7, 9A, 9B, 11A, 12A are cross sectional views of operations for manufacturing an interconnect structure with localized air gap, in accordance with some embodiments of the present disclosure.
Figure 6B:
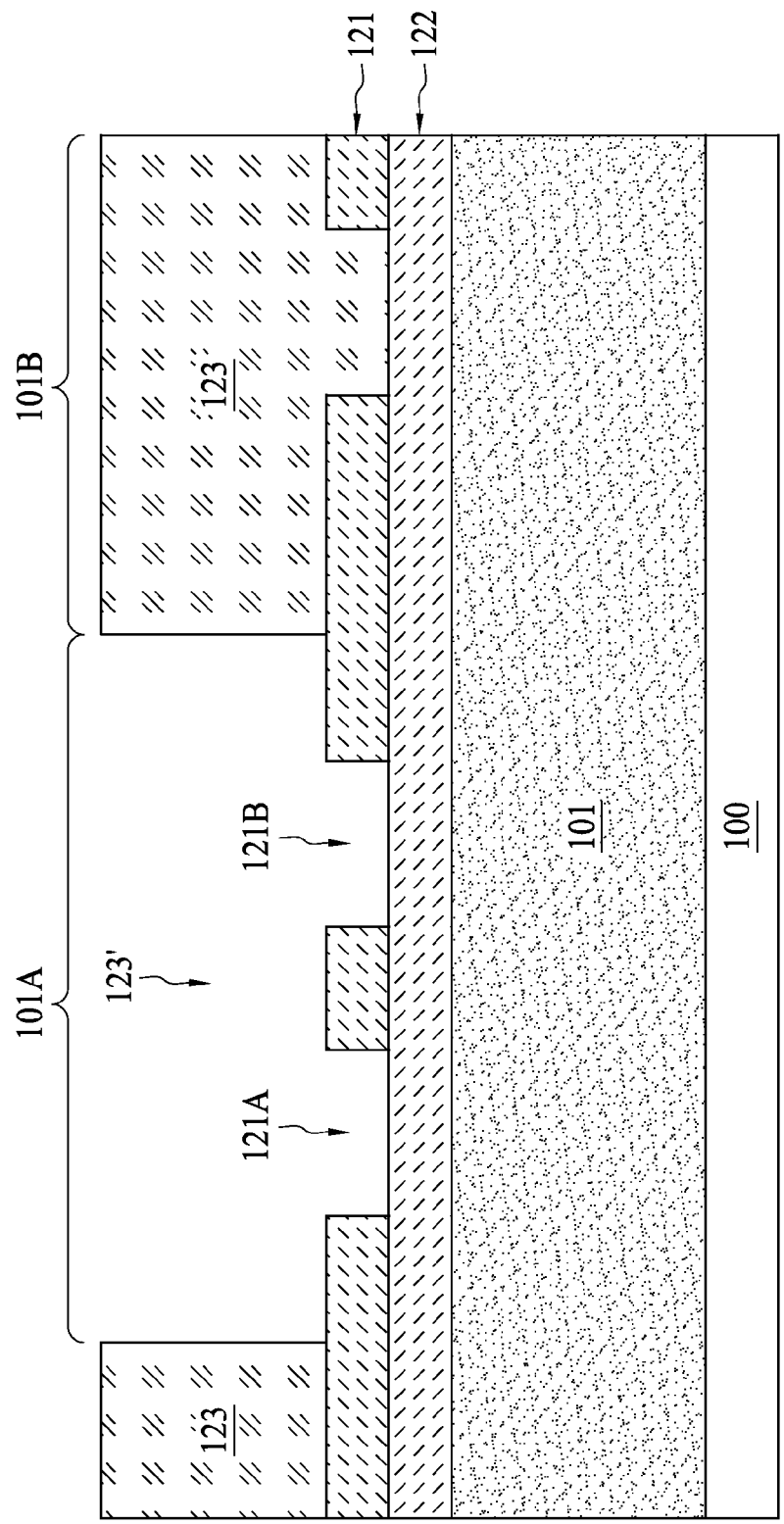
Figure 6C:
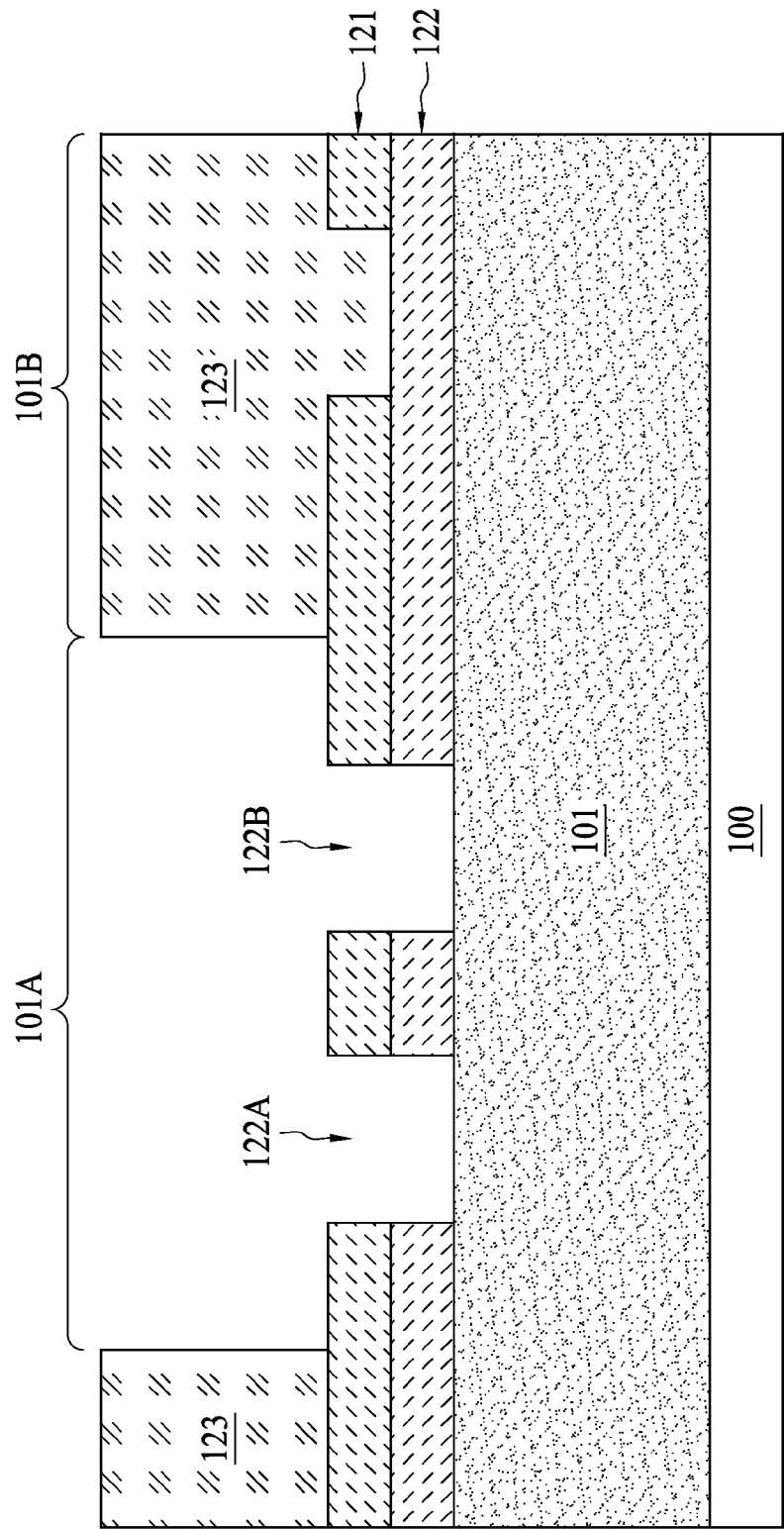

FIG. 6A to FIG. 12B are cross sectional views of operations for manufacturing an interconnect structure with localized air gap, in accordance with some embodiments of the present disclosure. Repeated numeral labels shown therein are referred to the same elements or their equivalents as previously discussed in the present disclosure, and are not repeated here for simplicity. Referring to FIGS. 6A, 6B, and 6C, a hard mask layer is patterned over the dielectric layer 101 and the substrate 100. In some embodiments, a first hard mask layer 121 is patterned over the second hard mask layer 122, as shown in FIG. 6A. The first hard mask layer 121 includes openings (121A, 121B, 121C). In FIG. 6B, a photoresist layer 123 is subsequently formed over the first hard mask layer 121, exposing openings 121A and 121B situated in the predetermined air gap region 101A, and covering the opening 121C in the non-air gap region 101B. An opening 123' of the photoresist layer 123 defines the air gap region 101A as discussed previously in the present disclosure. In FIG. 6C, the portion of the second hard mask layer 122 exposed from the openings 121A, 121B of the first hard mask layer 121 is removed. Consequently, a portion of the dielectric layer 101 is exposed from the openings 122A, 122B of the second hard mask layer 122.

Figure 7:
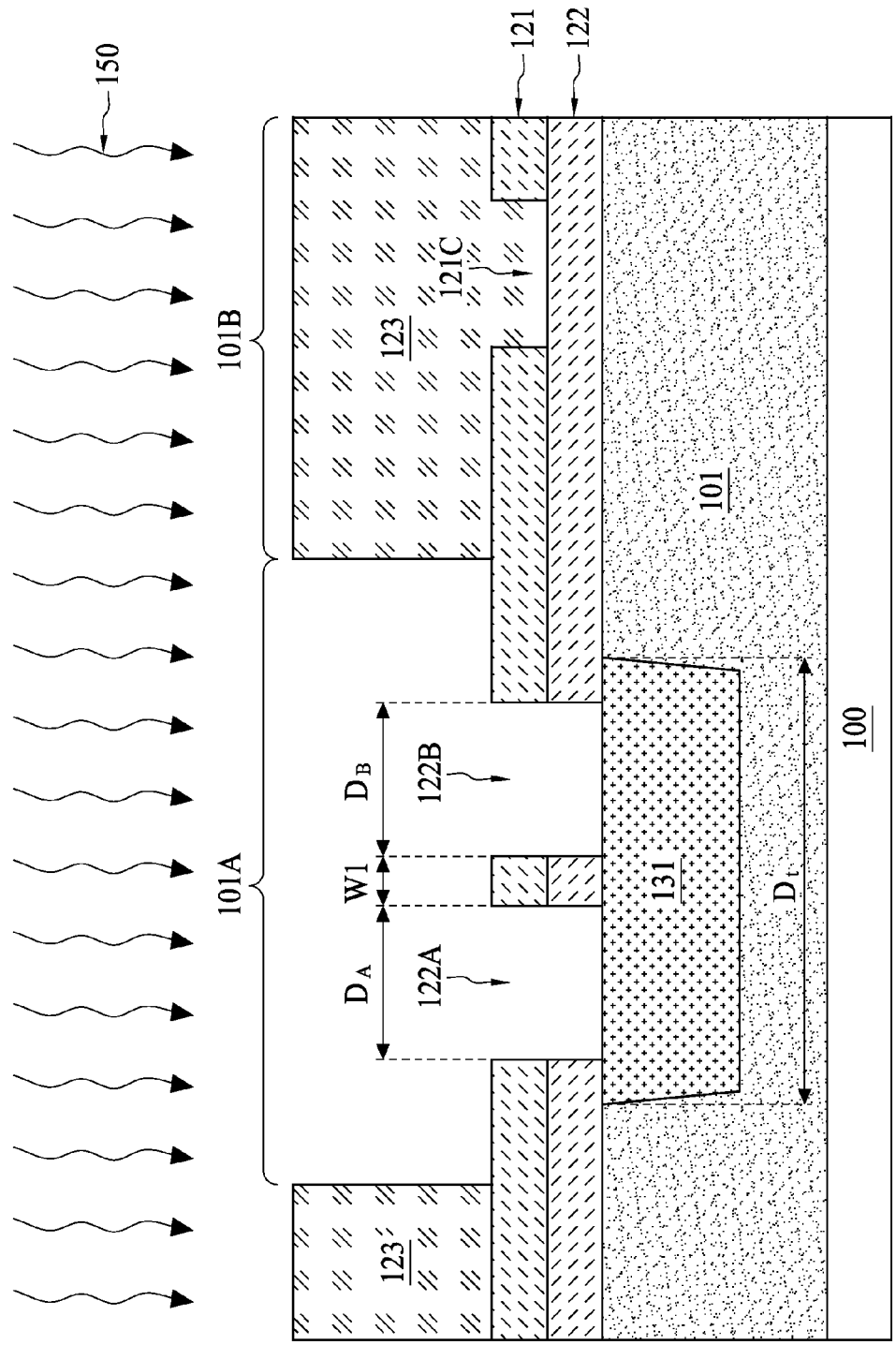

Referring to FIG. 7, a dielectric layer treatment is conducted through the openings 122A, 122B of the second hard mask layer 122. In some embodiments, the dielectric layer treatment is to transform a portion of the original dielectric layer 101 to a treated dielectric region 131 that has a lateral dimension $D_t$ greater than a width $D_A$ and $D_B$ of the openings (122A, 122B) of the second hard mask layer 122. In other words, the lateral dimension $D_t$ of the treated dielectric region 131 is greater than $D_A+D_B$. In some embodiments, the treatment is to obtain a more hydrophilic portion in the dielectric layer 101. For example, if the dielectric layer 101 is made of SiOC, microwave plasma can be used to decrease the carbon content in specific portion of the dielectric layer 101 and replace SiOC with SiOH. The hydrophilicity of the treated dielectric region 131 is increased. The treated dielectric region 131 is hence easier to be etched by wet chemical etch operation, such as by diluted HF.

As shown in FIG. 7, in some embodiments, the dielectric layer treatment includes applying microwave plasma 150 to the interconnect structure in a plasma chamber with pressure in a range of from about 100 mTorr to about 2000 mTorr. The temperature in the chamber is maintained in a range of from about 60° C. to about 300° C., with a plasma gas chemistry including nitrogen ($N_2$), oxygen ($O_2$), and water ($H_2O$). In some embodiments, $N_2$ constitutes 3% to 60%, $O_2$ constitutes 20% to 98%, and $H_2O$ constitutes 3% to 98% of the gas flow for plasma treatment. In other embodiments, in addition to $N_2$, $O_2$, and $H_2O$, the plasma gas chemistry also includes $CF_4$ which, for example, constitutes below 5% of the gas flow.

Figure 8:
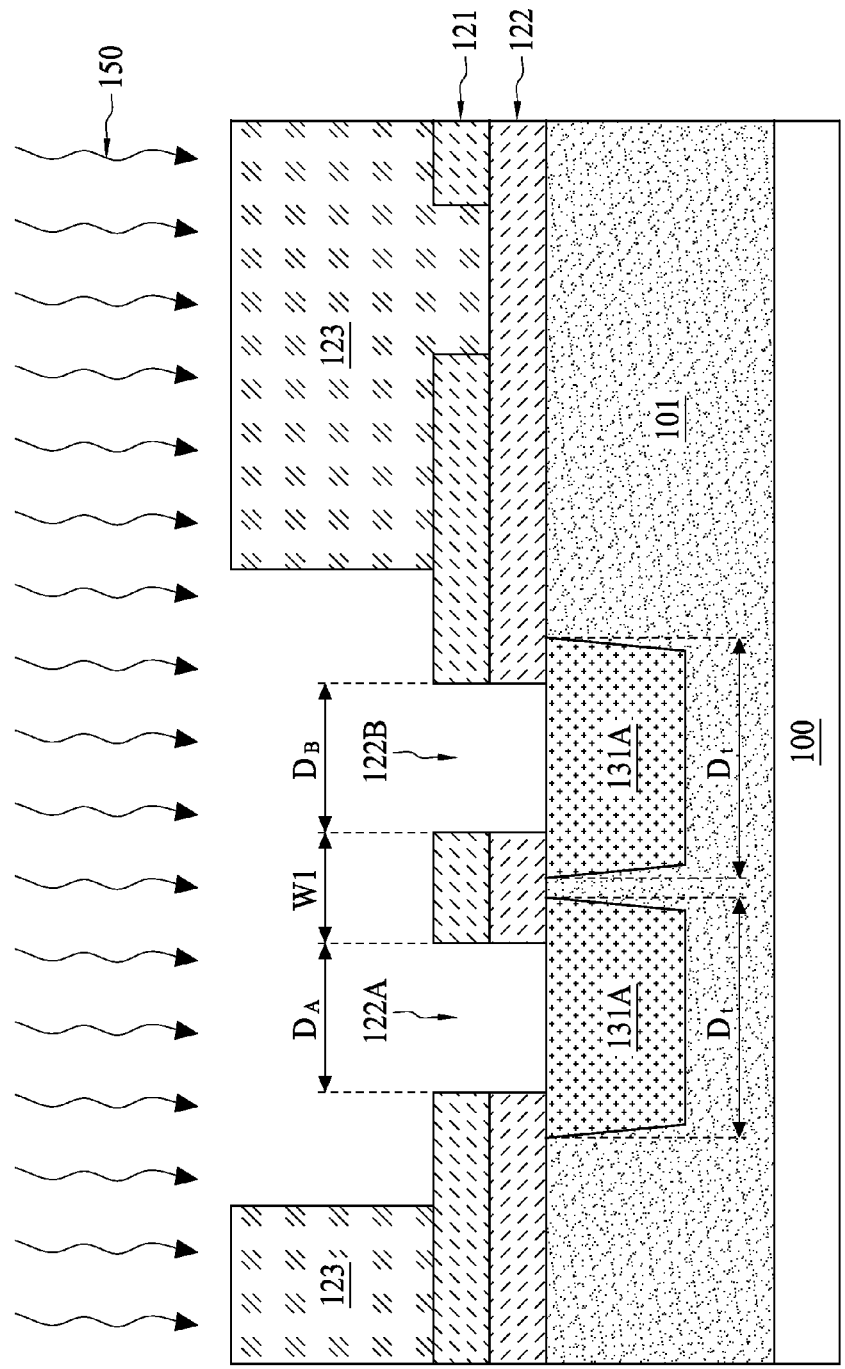

Comparing FIG. 7 and FIG. 8, the separation W1 of the two openings (122A, 122B) in FIG. 7 is below 50 nm, for example, 30 nm, and the separation W1 of the two openings (122A, 122B) in FIG. 8 is greater than 50 nm, for example, 80 nm. As such, the treated dielectric region 131 in FIG. 7 shows a continuous region without dielectric layer 101 separation, whereas the treated dielectric region 131 in FIG. 8 shows two individual regions 131A and 131B with dielectric layer 101 in between. The plasma treatment described herein induces lateral encroachment to a point that not only the exposed region under the openings 122A, 122B, but also the portion covered by the hard mask layers 121, 122 that is immediately adjacent to the exposed region, can be transformed to be more hydrophilic and become a part of the treated dielectric region 131. In some embodiments, the lateral encroachment of the treated dielectric region 131 described herein is below about 30 nm.

Figure 9A:
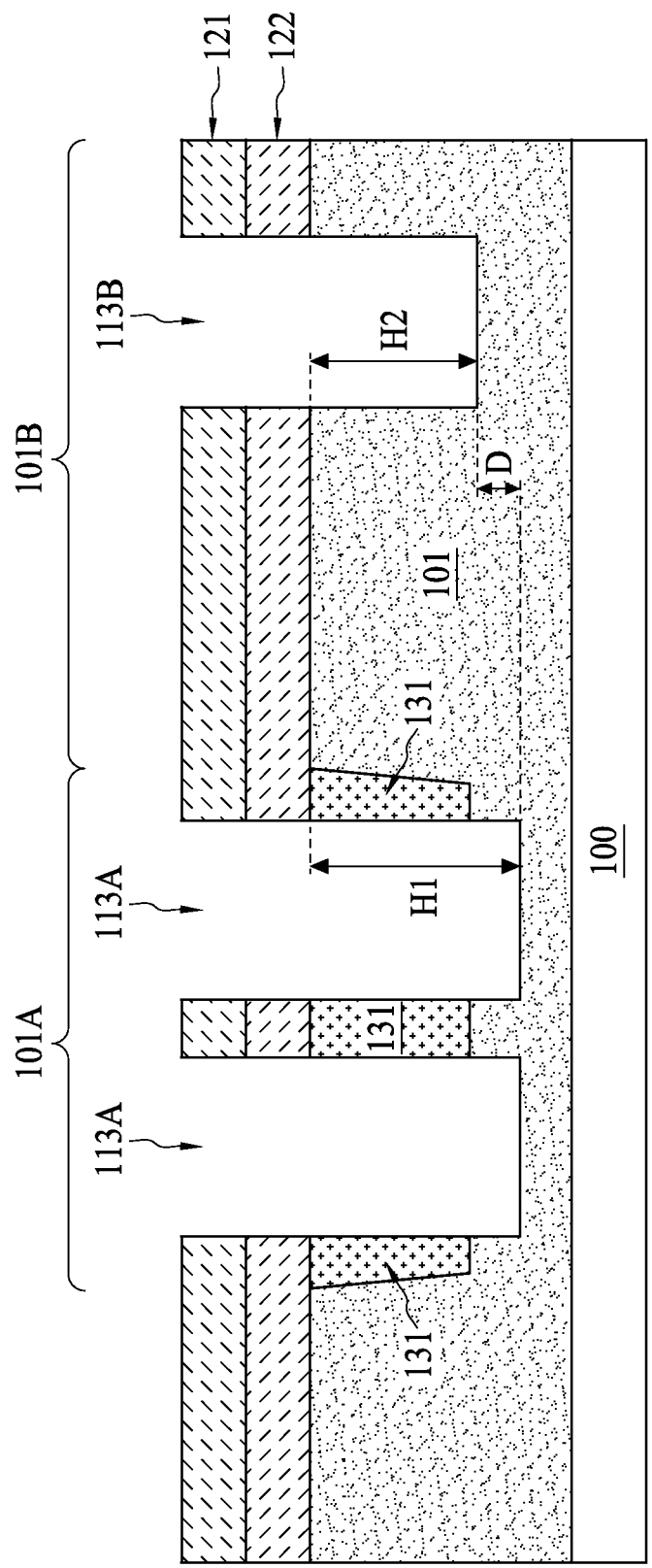
Figure 9B:
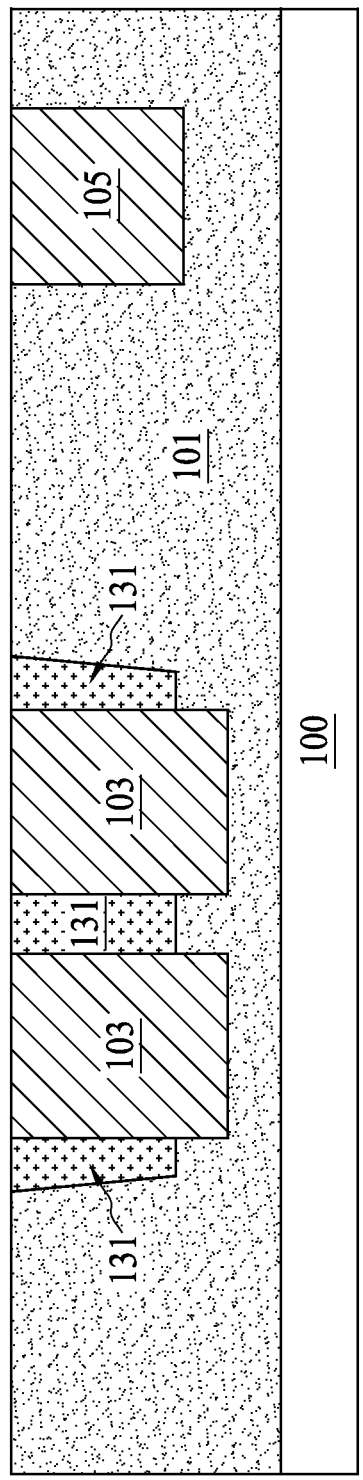

Referring to FIG. 7, FIG. 9A, and FIG. 9B, the photoresist layer 123 is removed, and the hard mask layer 122 in the non-air gap region 101B is then exposed. Conductive line trenches 113A and 113B are formed after an anisotropic etch through the openings 122A, 122B, and 121C. Note in FIG. 9A, a height H2 of the conductive line trench 113B is less than the height H1 of the conductive line trench 113A by a difference D. Related discussion to the difference D can be referred to FIG. 1 of the present disclosure. However, the height H2 of the conductive line trench 113B can be more than the height H1 of the conductive line trench 113A by a difference D as previously discussed in FIG. 2 and FIG. 3. Different treatment used to change the chemical property of the treated dielectric region 131 can cause a faster or a slower etch rate in the treated dielectric region 131 than the dielectric layer 101. As shown in FIG. 9A, the etch rate of the treated dielectric region 131 in the air gap region 101A is faster than the etch rate of the dielectric layer 101 in the non-air gap region 101B. In some embodiments, the difference D can be caused by etching an extra second hard mask layer 122 exposed from the opening 121C after the removal of the photoresist layer 123, while the anisotropic etch for creating the conductive line trenches 113A, 113B is in progress. FIG. 9B shows a metallization operation that fills the conductive line trenches 113A, 113B with conductive materials and forms the first conductive line 103 and the second conductive line 105. In some embodiments, the metallization operation includes chemical vapor deposition, physical vapor deposition, coating, electroplating, or the combination thereof. A planarization operation may follow the metallization operation to expose the treated dielectric region 131.

Figure 10A:
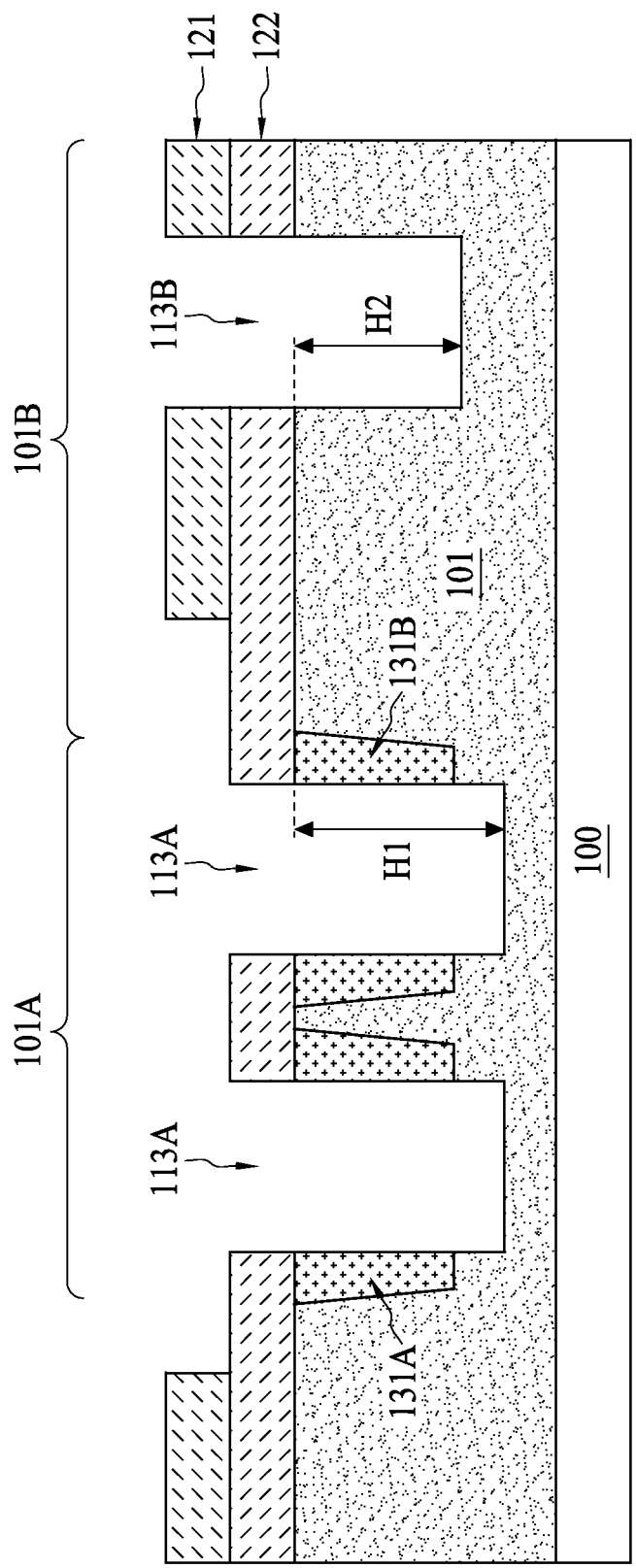
Figure 10B:
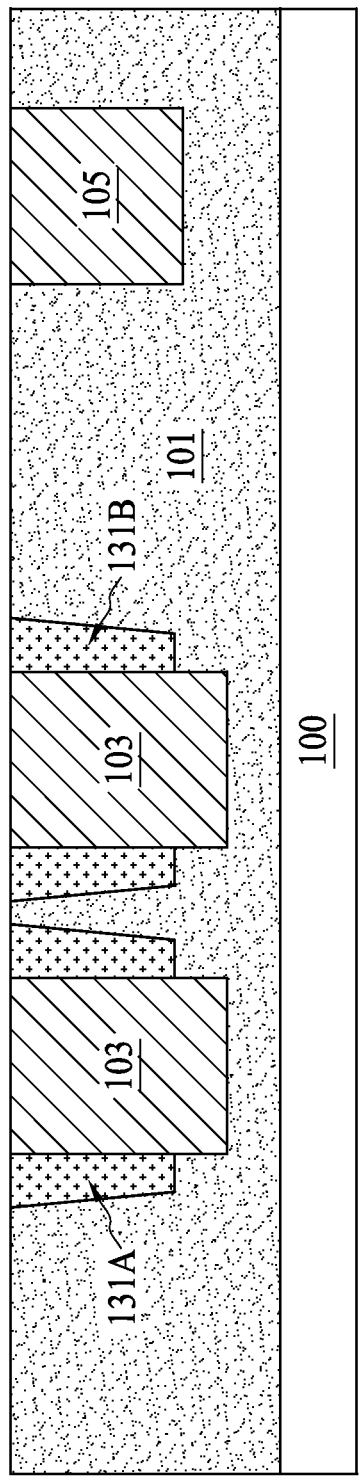

Referring to FIG. 8, FIG. 10A, and FIG. 10B, the photoresist layer 123 is removed, and the hard mask layer 122 in the non-air gap region 101B is then exposed. Conductive line trenches 113A and 113B are formed after an anisotropic etch through the openings 122A, 122B, and 121C. Note in FIG. 10A, a height H2 of the conductive line trench 113B is less than the height H1 of the conductive line trench 113A by a difference D. Related discussion to the difference D can be referred to FIG. 1 of the present disclosure. However, the height H2 of the conductive line trench 113B can be more than the height H1 of the conductive line trench 113A by a difference D as previously discussed in FIG. 2 and FIG. 3. Different treatment used to change the chemical property of the treated dielectric region 131 can cause a faster or a slower etch rate in the treated dielectric region 131 than the dielectric layer 101. As shown in FIG. 10A, the etch rate of the treated dielectric region 131 in the air gap region 101A is faster than the etch rate of the dielectric layer 101 in the non-air gap region 101B. In some embodiments, the difference D can be caused by etching an extra second hard mask layer 122 exposed from the opening 121C after the removal of the photoresist layer 123, while the anisotropic etch for creating the conductive line trenches 113A, 113B is in progress. FIG. 10B shows a metallization operation that fills the conductive line trenches 113A, 113B with conductive materials and forms the first conductive line 103 and the second conductive line 105. In some embodiments, the metallization operation includes chemical vapor deposition, physical vapor deposition, coating, electroplating, or the combination thereof. A planarization operation may follow the metallization operation to expose the treated dielectric region 131.

Figure 11A:
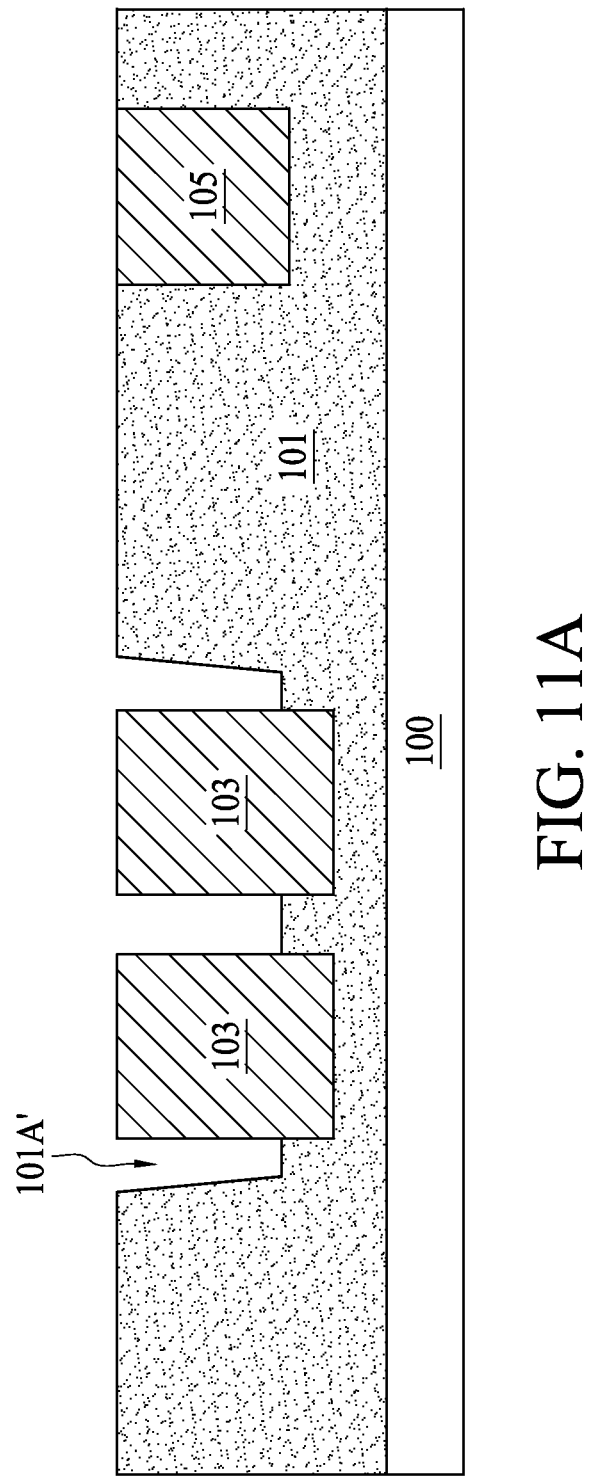
Figure 11B:
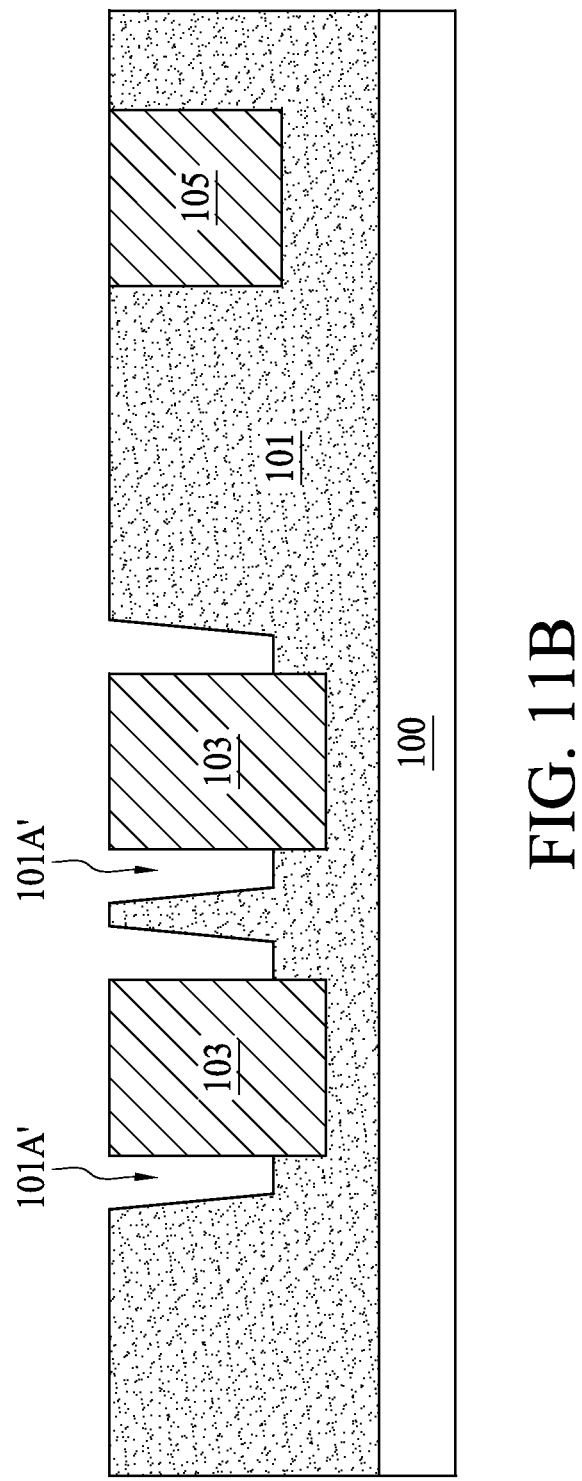

Referring to FIG. 9B, FIG. 10B, FIG. 11A, and FIG. 11B, the treated dielectric region 131 is removed by fluoride-containing chemical etch, such as a diluted HF wet etch. An air gap 101A' is defined after the removal of the treated dielectric region 131. In some embodiments, corrosion inhibitor such as suitable organic materials that includes a hydrophilic end and a hydrophobic end can be added to the chemical etchant to prevent damage to the first conductive line 103. In some embodiments, metal inhibitor can be Bezotrialole which inhibits corrosion of copper by forming an inert layer of this polymer on the metal's surface. As shown in FIG. 11A, a continuous air gap 101A' is formed, surrounding the first conductive lines 103, whereas in FIG. 11B, two individual air gaps 101A' are formed. Because no treated dielectric region is formed in proximity to the second conductive line 105, no air gap is formed near the second conductive line 105.

Referring to FIG. 12A to FIG. 13B, a cap layer 107 having a thickness of from about 5 Å to about 50 Å is formed over the air gap region 101A and the non-air gap region 101B. In some embodiments, the cap layer 107 is formed by conducting a chemical vapor deposition (CVD), physical vapor deposition (PVD), remote plasma CVD (RPCVD), plasma enhanced CVD (PECVD), a coating operation, or other suitable deposition processes. The materials used for the cap layer 107 are previously discussed in FIG. 2.

Figure 12A:
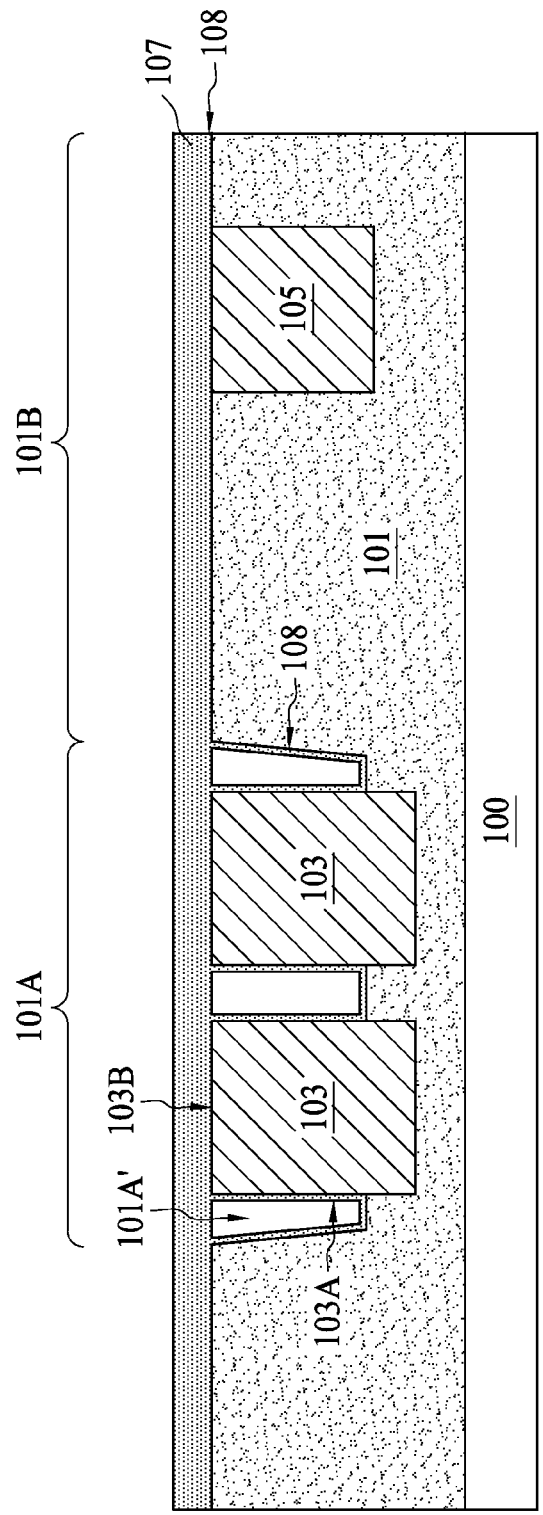
Figure 12B:
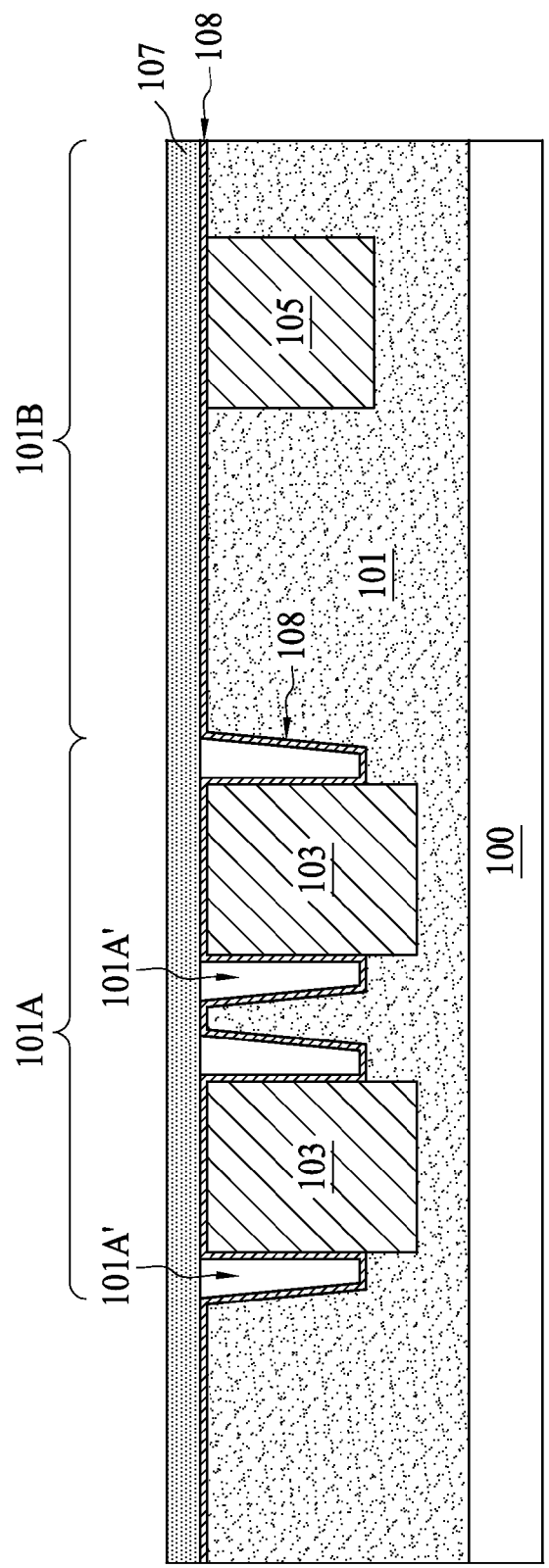

In FIG. 12A and FIG. 12B, a conformal barrier layer 108 having a thickness of from about 5 Å to about 50 Å is formed in the air gap 101A' by an atomic layer deposition (ALD). The conformal barrier layer 108 covers the sidewall and the bottom of the air gap 101A, as well as the sidewall 103A and the top surface 103B of the first conductive line 103. In some embodiments, the cap layer 107 and the conformal barrier layer 108 are formed in a single deposition operation. For example, as shown in FIG. 12A, the conformal barrier layer 108 is the initial deposition of the cap layer 107 formation before the film laterally coalescence. In another example, as shown in FIG. 12B, the cap layer 107 and the conformal barrier layer 108 are made of different materials and are formed in two different operations.

Figure 13A:
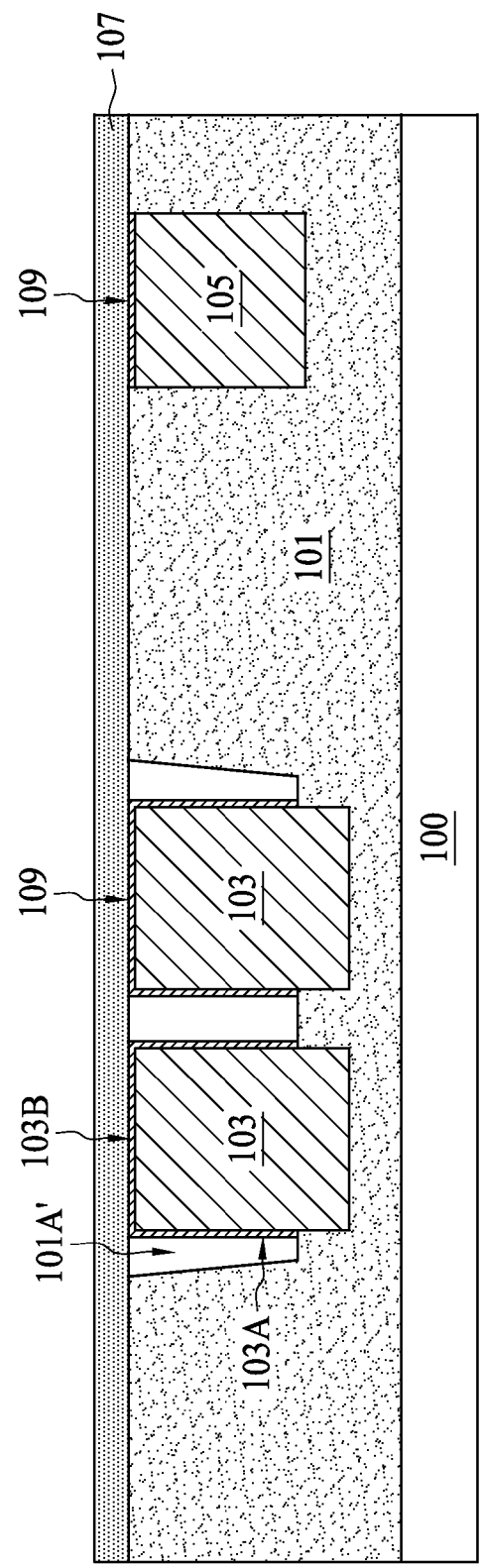
FIG. 13A is a cross sectional view of an interconnect structure with localized air gap, in accordance with some embodiments of the present disclosure.
Figure 13B:
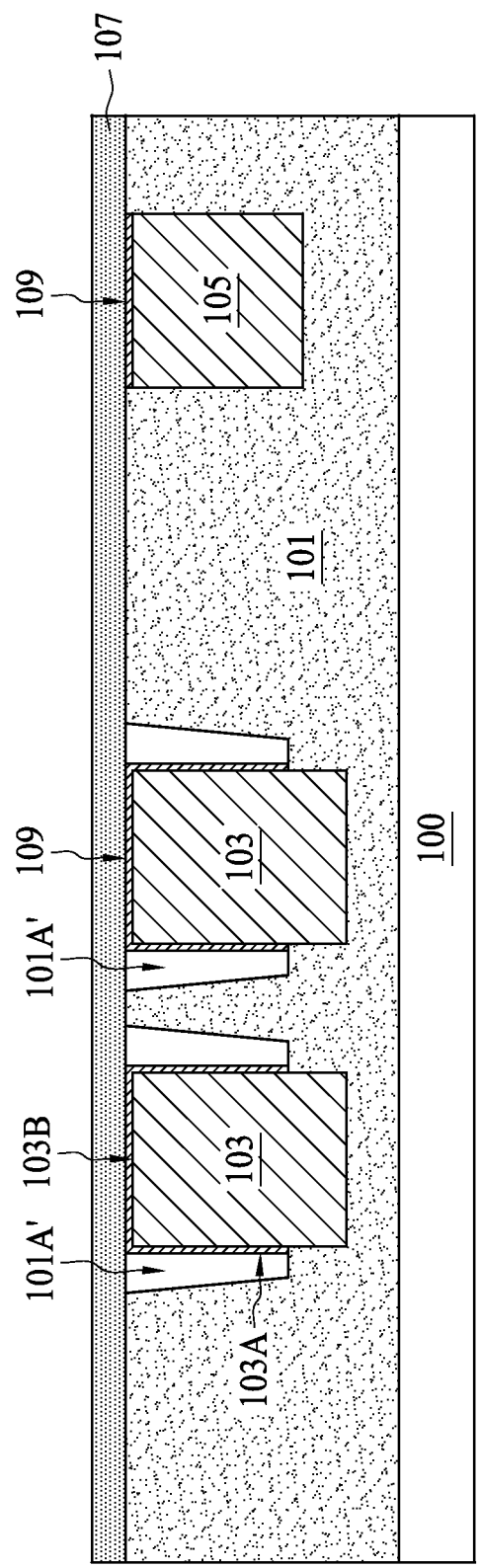
FIG. 13B is a cross sectional view of an interconnect structure with localized air gap, in accordance with some embodiments of the present disclosure.

Referring to FIG. 13A and FIG. 13B, a metal layer 109 is selectively formed over the first conductive lines 103 and the second conductive line 105. In some embodiments, the metal layer 109 is formed by conducting a chemical vapor deposition (CVD), remote plasma CVD (RPCVD), plasma enhanced CVD (PECVD), or other suitable deposition processes. The materials suitable for the metal layer 109 are previously discussed in FIG. 4. Because the metal layer 109 only selectively deposited over conductive surface, only the sidewall 103A, the top surface 103B of the first conductive line 103, and the top surface 105B of the second conductive line 105 are covered with the metal layer 109.

Some embodiments of the present disclosure provides an interconnect structure including a substrate and a low k dielectric layer. The low k dielectric layer has an air gap region and a non-air gap region. A first conductive line is positioned in the air gap region, and a second conductive line is positioned in the non-air gap region of the low k dielectric layer. A major direction of the first conductive line and a major direction of the second conductive line are substantially perpendicular to the substrate. A height of the first conductive line along the major direction of the first conductive line is different from a height of the second conductive line along the major direction of the second conductive line.

In some embodiments of the present disclosure, a ratio of the height of the first conductive line and the height of the second conductive line is in a range of from about 0.8 to about 1.5.

In some embodiments of the present disclosure, a separation between two adjacent first conductive lines is less than about 50 nm.

In some embodiments of the present disclosure, further including a cap layer over the air gap region of the low k dielectric layer.

In some embodiments of the present disclosure, further including a conformal barrier layer over the low k dielectric layer and the first conductive line.

In some embodiments of the present disclosure, materials of the cap layer are substantially the same as materials of the conformal barrier layer.

In some embodiments of the present disclosure, further including a conformal metal layer over a top surface and a sidewall of the first conductive line In some embodiments of the present disclosure, further including an internal low k material between two adjacent first conductive lines.

In some embodiments of the present disclosure, a largest separation between a sidewall of the first conductive line and the internal low k material is below about 50 nm.

Some embodiments of the present disclosure provides a semiconductor interconnect structure, including a substrate, a low k dielectric layer over the substrate, an air gap in the low k dielectric layer, a first conductive line and a second conductive line. The first conductive line is in the low k dielectric layer and is surrounded by the air gap. The second conductive line is in the low k dielectric layer and is surrounded by the low k dielectric layer. A bottom of the first conductive line is lower than a bottom of the second conductive line.

In some embodiments of the present disclosure, further including a conformal barrier layer made of ceramics, metal oxynitride, dielectric film, or a combination of the above materials.

In some embodiments of the present disclosure, further including a cap layer over the air gap. The cap layer is made of ceramics, metal oxynitride, dielectric film, organic polymer films, or the combination of the above materials.

Some embodiments of the present disclosure provide a method for manufacturing a semiconductor interconnect structure. The method includes (1) forming a photoresist layer over a hard mask layer with openings exposing a low k dielectric layer. The photoresist layer exposing a predetermined air gap region of the low k dielectric layer; (2) Treating the low k dielectric layer to be more hydrophilic through the openings of the hard mask layer, and obtaining a treated low k dielectric region with a greater lateral dimension than a width of the openings of the hard mask layer; (3) Removing a portion of the treated low k dielectric region through the openings of the hard mask layer to form a conductive line trench; (4) Metalizing the conductive line trench to form a conductive line; and (5) removing the treated low k dielectric region to form an air gap in the air gap region.

In some embodiments of the present disclosure, the treating the low k dielectric layer includes reducing carbon content in the low k dielectric layer.

In some embodiments of the present disclosure, the treating the low k dielectric layer includes applying microwave plasma under a pressure of from about 200 mTorr to about 2000 mTorr.

In some embodiments of the present disclosure, the microwave plasma includes nitrogen, oxygen, water, and optionally fluoride gas.

In some embodiments of the present disclosure, the removing the treated low k dielectric region includes applying a fluoride-based wet etch.

In some embodiments of the present disclosure, the method further includes forming a cap layer over the air gap region by a chemical vapor deposition, a physical vapor deposition, a coating operation, or a combination of the above operations.

In some embodiments of the present disclosure, the method further includes forming a conformal barrier layer in the air gap by an atomic layer deposition (ALD) operation.

In some embodiments of the present disclosure, the method further includes selectively forming a metal layer over the conductive line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An interconnect structure, comprising:
a low k dielectric layer over a substrate, comprising an air gap region having an air gap and a non-air gap region, the air gap further comprising a tapered sidewall and a bottom surface defined by the low k dielectric layer;
a first conductive line in the air gap region; and
a second conductive line in the non-air gap region,
wherein a major direction of the first conductive line and a major direction of the second conductive line are substantially perpendicular to the substrate, and a height of the first conductive line along the major direction thereof is different from a height of the second conductive line along the major direction thereof.

2. The interconnect structure of claim 1, wherein a ratio of the height of the first conductive line and the height of the second conductive line is in a range of from about 0.8 to about 1.5.

3. The interconnect structure of claim 1, wherein a separation between two adjacent first conductive lines is less than about 50 nm.

4. The interconnect structure of claim 1, further comprising a cap layer over the air gap region of the low k dielectric layer.

5. The interconnect structure of claim 4, further comprising a conformal layer composed of a single material being in direct contact with a top surface of the first conductive line and a top surface of the second conductive line.

6. The interconnect structure of claim 5, wherein materials of the cap layer are substantially the same as materials of the conformal layer.

7. The interconnect structure of claim 6, further comprising an internal low k material between two adjacent first conductive lines.

8. The interconnect structure of claim 7, wherein a largest separation between a sidewall of the first conductive line and the internal low k material is below about 50 nm.

9. The interconnect structure of claim 5, wherein the conformal layer comprising metal.

10. The interconnect structure of claim 1,
wherein a bottom portion of the first conductive line is surrounded by the low k dielectric layer and a top portion of the first conductive line is surrounded by an air gap of the air gap region.

11. The interconnect structure of claim 10, further comprising:
a plurality of first conductive lines in the air gap region, a largest separation between two adjacent first conductive lines is less than about 50 nm.

12. The interconnect structure of claim 10, further comprising:
a cap layer over the air gap region and the non-air gap region;
a third conductive line over the air gap region; and
a fourth conductive line over the non-air gap region.

13. The interconnect structure of claim 12, wherein a width of the third conductive line is less than a width of the underlying first conductive line.

14. The interconnect structure of claim 12, wherein the fourth conductive line is partially overlaid on the second conductive line.

15. A semiconductor interconnect structure, comprising:
a low k dielectric layer over a substrate;
an air gap in the low k dielectric layer, the air gap comprising a tapered sidewall and a substantially flat bottom surface defined by the low k dielectric layer;
a first conductive line in the low k dielectric layer, surrounded by the air gap; and
a second conductive line in the low k dielectric layer, surrounded by the low k dielectric layer;
wherein a bottom of the first conductive line is lower than a bottom of the second conductive line.

16. The semiconductor interconnect structure of claim 15, further comprising a conformal barrier layer made of ceramics, metal oxynitride, dielectric film, or a combination thereof.

17. The semiconductor interconnect structure of claim 15, further comprising a cap layer over the air gap, composed of ceramics, metal oxynitride, dielectric film, organic polymer films, or the combination thereof.

18. The semiconductor interconnect structure of claim 15, wherein a difference between the bottom of the first conductive line and the bottom of the second conductive line is in a range of from about 10% to about 50% of a height of the first conductive line.

19. The semiconductor interconnect structure of claim 15, wherein a width of the air gap between the first conductive line and the low k dielectric layer is less than about 50 nm.

20. The semiconductor interconnect structure of claim 15, further comprising a conformal metal layer over a top surface and a sidewall of the first conductive line.

* * * * *